United States Patent [19]

Mecklenburg, III

[11] 4,080,729

[45] Mar. 28, 1978

[54] METHOD FOR TRANSFERRING ELECTRICAL COMPONENTS FROM A BREADBOARD TO A PRINTED CIRCUIT BOARD

[76] Inventor: Alfred C. Mecklenburg, III, 93 Beacon St., Apt. 8, Boston, Mass. 02108

[21] Appl. No.: 763,062

[22] Filed: Jan. 27, 1977

[51] Int. Cl.² .............................................. H05K 3/30
[52] U.S. Cl. ........................................ 29/626; 29/423; 29/464; 29/739; 29/741; 29/764
[58] Field of Search ................. 29/625, 626, 407, 423, 29/464, 467, 468, 739, 741, 764

[56] References Cited

U.S. PATENT DOCUMENTS

| | | | |
|---|---|---|---|
| 3,058,440 | 10/1962 | Berry | 29/764 X |
| 3,372,455 | 3/1968 | Howie | 29/626 |
| 3,496,419 | 2/1970 | Sakellakis | 29/626 X |
| 3,540,718 | 11/1970 | Heffron et al. | 29/626 X |
| 3,568,129 | 3/1971 | Gold et al. | 29/626 X |

Primary Examiner—Victor A. DiPalma
Attorney, Agent, or Firm—David E. Brook

[57] ABSTRACT

An improved method for transferring electrical components from a breadboard to a printed circuit board and mounting the components thereon is disclosed, as well as an apparatus for facilitating such transfer and mounting. In a preferred case, the breadboard comprises a solderless breadboard socket. A printed circuit board having a drilled hole pattern and circuit pattern matching that of a solderless breadboard socket is placed over the solderless breadboard socket so that the holes in each are aligned. Breadboarding is done by pushing the leads of various components through the printed circuit board and into the solderless breadboard socket. When the desired circuit is completed, the composite is utilized as one side of a container with the component side forming an inner surface thereof. Particles smaller than the components, such as polymer pellets, are introduced into the container to surround and cover the components and hold the components in place. The solderless breadboard socket is then removed and the component leads can be soldered to the appropriate conductive strips thereby completing mounting of the circuit on the printed circuit board.

6 Claims, 7 Drawing Figures

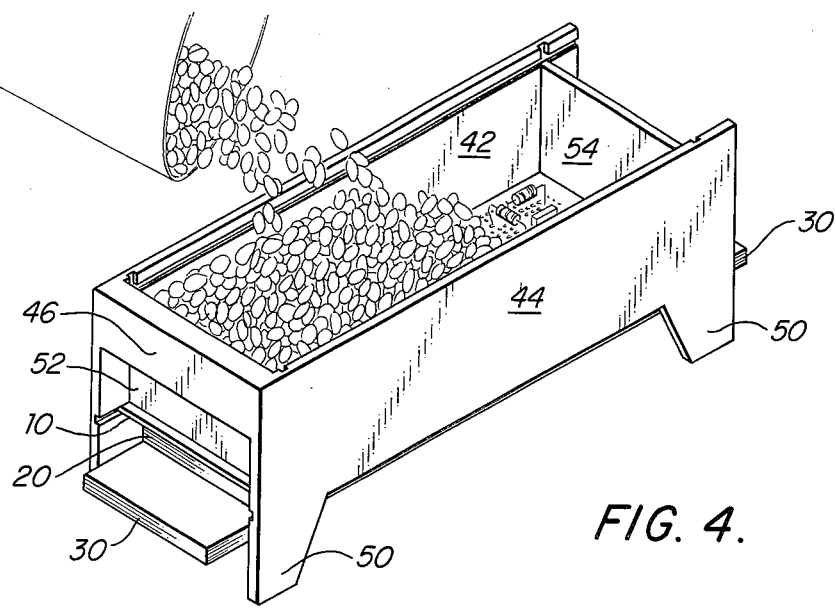
FIG. 4.
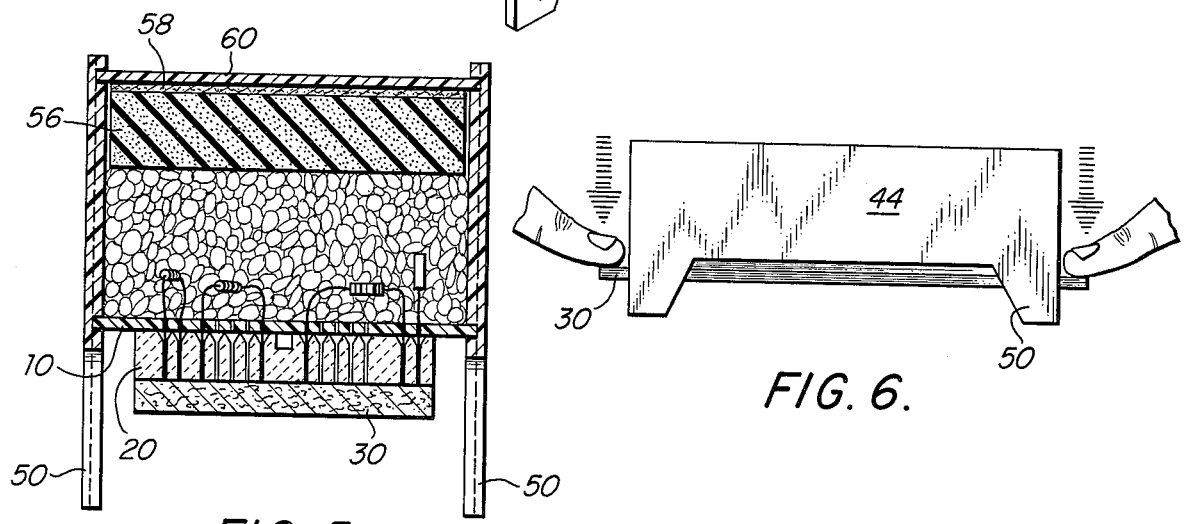
FIG. 5.
FIG. 6.
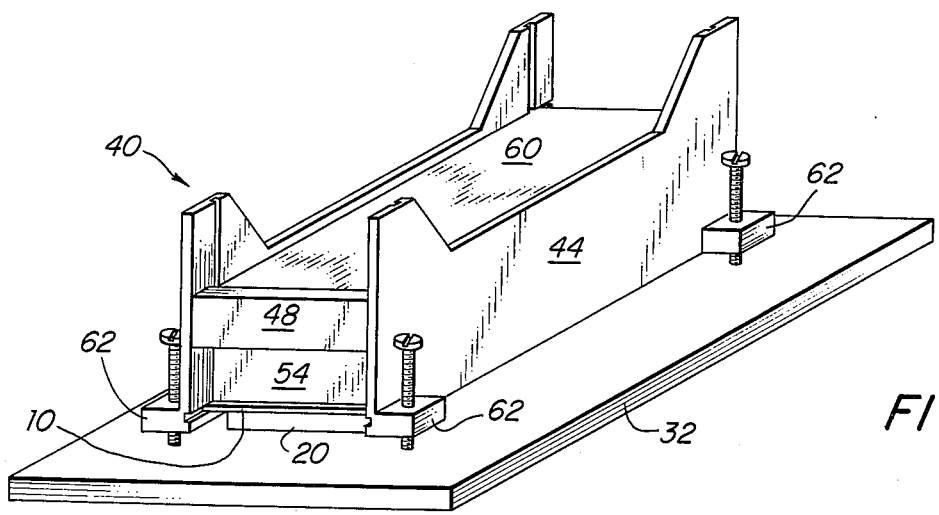
FIG. 7.

METHOD FOR TRANSFERRING ELECTRICAL COMPONENTS FROM A BREADBOARD TO A PRINTED CIRCUIT BOARD

BACKGROUND OF THE INVENTION

1. Field of the Invention

This invention is in the field of printed circuit boards and more particularly relates to methods for breadboarding a variety of circuit configurations and subsequently mounting the components for a particularly desired configuration on a printed circuit board.

2. Description of the Prior Art

Printed circuit boards have come into common usage in the electronics industry for a wide variety of applications. Usually, printed circuit boards are formed from a base of insulating material, such as a phenolic resin. This conducting strips, such as those which can be formed by selectively etching away a layer of copper, are bonded to the insulating support. A pattern of mounting holes extends through the board so that various electronic components, such as resistors, transistors, diodes, jumper wires, etc., can be mounted on one surface of the board by inserting their leads through the board. Thin conducting strips are typically present on both surfaces of the board, although some boards have such strips on one side only. The leads of the electronic components extend through the printed circuit board and are joined in electrical contact with the thin conducting strips by soldering them thereto.

Often, it is desirable to test a number of experimental circuits by repeatedly inserting and removing a variety of electronic components from a circuit board which provides for interconnection between the components. This procedure is known as breadboarding and is designed to provide for the rapid interconnection, testing and removal of various electronic components until a final circuit is decided upon.

There are, of course, many known systems for breadboarding electronic circuits. Generally, all of these systems can be divided into two main categories: those that require soldering to make interconnections between components, and those in which interconnections are made in a mechanical fashion only.

An example of a breadboard system which requires soldering is described in U.S. Pat. No. 3,496,419 to Sakellakis. In this system, a circuit board is provided with conductive pads corresponding to component lead patterns to which component leads are tack soldered. Interconnections are made by soldering jumper wires from pad to pad. Since a large number of components are frequently added and subsequently removed in the experimentation leading up to the final design of the circuit, however, the requirement for soldering and desoldering each interconnection is inordinately time consuming and a distinct disadvantage.

Mechanical breadboarding systems overcome this problem and provide for a quicker means for inserting and removing components from the experimental circuits. These mechanical systems, however, also have significant drawbacks. For example, many systems require the insertion of various types of terminals into holes in a prepunched board and these terminals are usually large compared to the size of the components connected which does not allow for a compact circuit layout. Also, the use of such terminals can result in loose connections making the circuit difficult to test and unreliable for use after the breadboarding phase is completed.

Solderless breadboard sockets overcome some of the problems found in other mechanical systems. With solderless breadboard sockets, connections are made by inserting component leads into rows and columns of spring-loaded connector strips imbedded in a plastic socket. The socket provides insulation between connector strips and a matrix of holes over the strips which serves to guide the component leads into the spring-loaded fingers of the connector strips. The rows and columns of connector strips are closely spaced in a relatively low profile compared to other mechanical terminals. Therefore, solderless breadboard sockets provide a means for creating a relatively compact and uncluttered breadboard version of a circuit.

Although components can be connected and disconnected to a solderless breadboard socket quickly and simply, and circuits can be laid out with a component density approaching that of a custom designed printed circuit board, one of the major problems of other mechanical systems remains. That is, the mechanical means of making interconnections is not reliable enough to be used beyond the breadboard stage. Therefore, the final circuit configuration must be removed from the solderless breadboard socket, one component at a time, and transferred to another board, usually a printed circuit board. Each component must be then connected to the printed circuit board in a permanent fashion, usually by soldering. As can be appreciated, this transfer from a solderless breadboard socket to a printed circuit board is a tedious and time consuming process.

Printed circuit boards have been manufactured with a drilled hole pattern and circuit pattern stated to match the patterns of a solderless breadboard socket. In practice, the patterns are sometimes found not to match, and in any event, such boards are used by placing them beside a solderless breadboard socket and transferring components one-by-one. This is still tedious and time consuming.

SUMMARY OF THE INVENTION

This invention relates to a new method for breadboarding electrical circuits, particularly on a solderless hreadboard socket, and eventually mounting one desired circuit configuration on a printed circuit board. In this invention, a printed circuit board with a drilled hole pattern and a circuit pattern matching that of a solderless breadboard socket is provided. The printed circuit board is positioned in a contacting face-to-face relationship with the solderless breadboard socket so that the matching patterns of holes and connector strips in each are aligned. Various circuits can then be breadboarded by inserting the leads of electronic components through the printed circuit board and into the solderless breadboard socket. Electrical contact between component leads at this stage of the process is made by the connecting strips of the solderless breadboard socket. When a desired circuit configuration is achieved, the printed circuit board/solderless breadboard socket composite is utilized as one side of a container so that the component side forms an inner surface of the container. The container is then filled with particles which surround and cover the components and the particles are enclosed within the container. The solderless breadboard socket can then be separated from the printed circuit board, and the contained pellets prevent components from being thrust from the printed circuit board. After separation, the printed circuit board is removed from the container and the leads of the various components are affixed to conductive strips on the board.

Thus, the method of this invention provides for the quick and convenient transfer of components from a solderless breadboard socket to a soldered, hard-wired version of the circuit. The tedious and time consuming transfer previously required is eliminated, thereby substantially increasing the usefulness of a solderless breadboard socket, particularly with complex circuit configurations.

BRIEF DESCRIPTION OF THE DRAWINGS

FIG. 4 is a perspective view illutrating the filling of the rectangular container with particles;

FIG. 5 is a cut-away cross-sectional view illustrating the rectangular container with a cover inserted over a foam member at the top surface of the particles;

FIG. 6 is a side elevation view illustrating one method of separating the solderless breadboard socket from the printed circuit board; and, FIG. 7 is a perspective view illustrating an alternative method of separating a solderless breadboard socket from a printed circuit board wherein the solderless breadboard socket is attached to a relatively large support.

DESCRIPTION OF PREFERRED EMBODIMENTS

The preferred embodiments of this invention will now be described by referring to the Figures in more detail.

Figure 1:
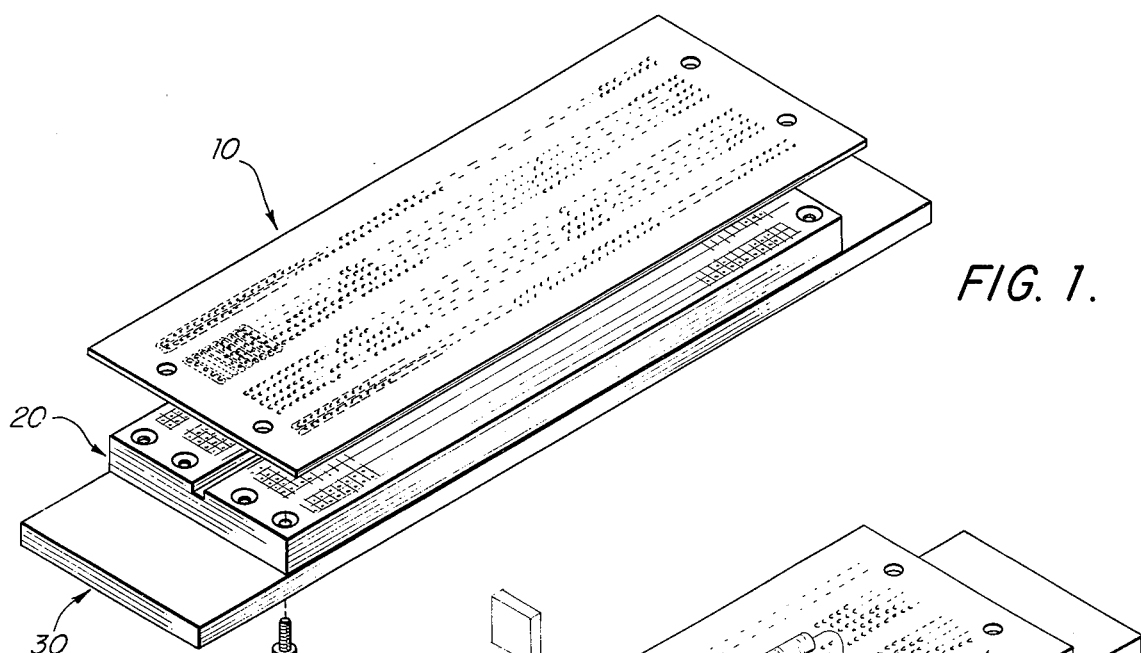
FIG. 1 is a perspective view illustrating a solderless breadboard socket attached to a support, which is optional, together with a matching printed circuit board.

In FIG. 1, a printed circuit board 10, which has been drilled and etched to match the physical and electrical configuration of solderless breadboard socket 20, is shown. Solderless breadboard socket 20 is shown attached by screws to a support 30, such as a wooden strip, which is optional. Support 30 does, however, facilitate separation of the solderless breadboard socket 20 from printed circuit board 10 later in the method described herein.

Solderless breadboard socket 20 has a pattern of holes and connector strips therein, and printed circuit board 10 is provided with matching hole and connector patterns. As shown, printed circuit board 10 has connector strips on its lower surface only.

Figure 2:
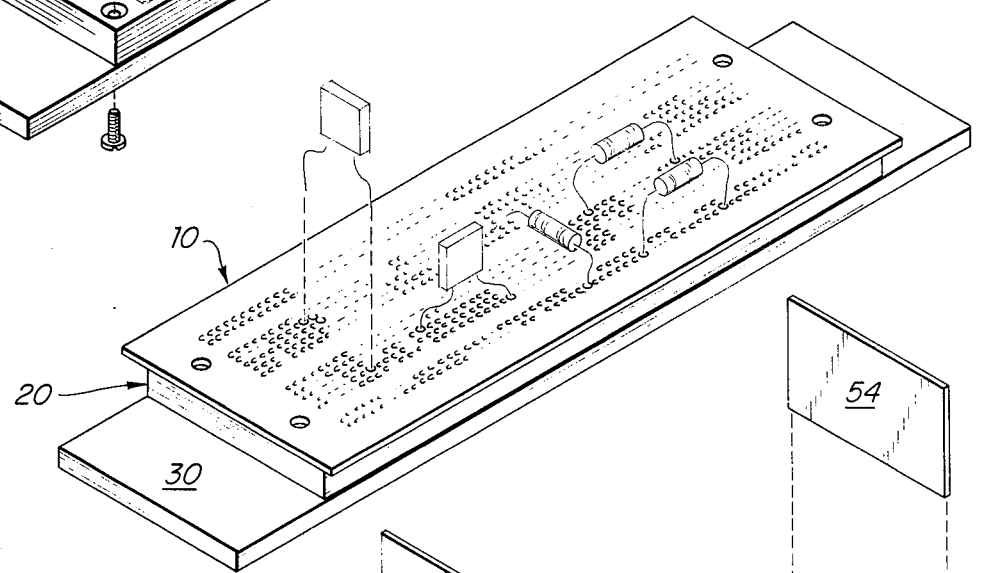
FIG. 2 is a perspective view illustrating the printed circuit board positioned on top of the solderless breadboard socket in an aligned relationship with electrical components arranged in a circuit having their leads extending through the board and into the breadboard socket.

Because of these matching patterns, printed circuit board 10 can be placed upon solderless breadboard socket 20 in an aligned relationship as illustrated in FIG. 2. Various electronic components, such as resistors, transistors, diodes, jumper wires, etc., can then be positioned on the surface of printed circuit board 10 by inserting their leads through printed circuit board 10 and into the holes in solderless breadboard socket 20. Integrated circuit modules could also be positioned on the surface of printed circuit board 10 and are considered within the term electronic components as used herein. Usually, integrated circuit modules have leads which are relatively short, but this can be overcome by the use of integrated circuit sockets which have longer leads.

Figure 3:
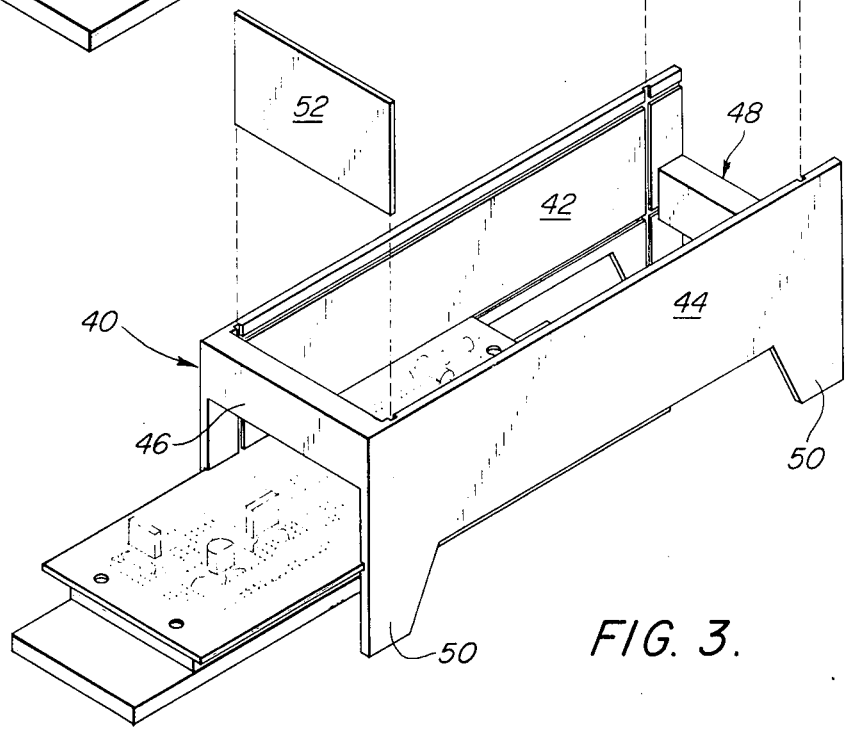
FIG. 3 is a perspective view illustrating insertion of the support/socket/board composite, as well as the end pieces, into a frame to result in the formation of a rectangular container.

When a desired circuit configuration is achieved, a composite formed from printed circuit board 10 and solderless breadboard socket 20 is inserted into a frame as the bottom surface of a container as illustrated in FIG. 3.

Frame 40 has two elongated, planar parallel side wall members, 42 and 44. At one end, brace 46 connects side wall members 42 and 44 across the top thereby leaving that end partially open below brace 46. At the other end, brace 48 connects side wall members across the bottom thereby leaving that end partially open above brace 48. Additionally, both the top and bottom of frame 40 are open. Frame 40 is supported by legs 50 which can be an extension from side walls 42 and 44 as illustrated.

The composite formed from printed circuit board 10, solderless breadboard socket 20, and support 30, is inserted as the bottom surface of the container by sliding printed circuit board 10 into the parallel horizontal slots at the lower inside surface of side wall members 42 and 44. When the composite is in place, end pieces 52 and 54 are inserted into the parallel verticle pairs of slots at both ends of wall members 42 and 44.

Particles are then introduced into the rectangular container formed as illustrated in FIG. 4. Suitable particles are generally relatively small, such as small spheres about 1/8 " in diameter. Of course, the particles do not have to be spheroidal in shape. These particles can be formed from a wide variety of materials, such as glass beads or polymer pellets. It is preferred that such pellets have sufficient temperature resistance to prevent softening under normal soldering temperatures.

A sufficient quantity of particles is introduced into the container to completely surround and cover the electronic components inserted through printed circuit board 10 and into solderless breadboard socket 20.

FIG. 5 illustrates one method for enclosing the particles within the container. Therein, it can be seen that a compressible material 56, such as foam rubber, is placed on top of the particles. Although optional, it is convenient to have the foam bonded to a relatively stiffer material 58, such as a thin plastic sheet, so that cover 60 can be inserted easily along the horizontal slots at the top of planar wall members 42 and 44. Compressible material 56 acts to equalize the forces applied when cover 60 is slid into position. When cover 60 is in place, the particles are contained within the rectangular container so formed and they act to hold each of the electronic components into place on circuit board 10.

To remove solderless breadboard socket 20, all that is necessary is to apply downward pressure. This can readily be achieved by hand pressure on the support as illustrated in FIG. 6. After the solderless breadboard socket is removed, the entire rectangular container can be flipped over so that the leads from the various components can be soldered and clipped short, or bent close to the board and clipped in preparation for later soldering. Thereafter, cover 60 and compressible material 56 can be removed, the particles can be emptied from the container, and printed circuit board 10 removed from the bottom slots.

Thus, the transfer of a breadboarded electronic circuit to a printed circuit board in a hard-wired fashion has been achieved by a relatively simple and quick procedure.

In some instances, solderless breadboard sockets are attached to relatively large supports which makes it inconvenient to slide the entire printed circuit board/solderless breadboard socket into the bottom of a rectangular container as previously illustrated. In such instances, rectangular frame 40 can still be used by inverting it as illustrated in FIG. 7. Frame 40 is attached to printed circuit board 10 by engaging board 10 in the slots at the bottom of inverted frame 40. As illustrated, solderless breadboard socket 20 is attached to relatively large support 32 which does not have to be moved to employ frame 40 in this alternate technique. After particles are introduced, the compressible material is inserted and cover 60 is inserted into the parallel horizontal slots running along the tops of side walls 42 and 44 in the inverted position of frame 40.

The same basic procedure is employed, except that solderless breadboard socket 20 can be removed from printed circuit board 10 by forcing frame 40 in an upward direction. This can be accomplished, for example, as illustrated by turning screws threaded through tapped holes in tabs 60 attached to the bottom of inverted rectangular frame 40. Rotation of the screws forces rectangular frame 40 to separate from solderless breadboard socket 20 and the component leads can be thereafter affixed to printed circuit board 10 as previously described.

Those skilled in the art will recognize many equivalents to the specific embodiments described herein. For example, although the method and apparatus of this invention were specifically described in regard to the separation of a solderless breadboard socket from a printed circuit board, they are also useful in other applications wherein components must be held on a circuit board until their leads can be affixed thereto. Such equivalents are intended to be covered by the following claims.

I claim:

1. A method for retaining electronic components positioned on a circuit board and having their leads inserted into holes extending through said board while their leads are affixed to the board, comprising:
   a. utilizing said circuit board as one side of a container;
   b. introducing particles into said container in a sufficient quantity to surround and cover the components;
   c. enclosing said container in a manner sufficient to insure that said particles hold the components in position on said board; and,
   d. affixing the leads of said components to said circuit board.

2. A method of claim 1 wherein the leads of said components are affixed by soldering them to conductive strips on said board.

3. A method for breadboarding electrical circuits on a solderless breadboard socket having a pattern of holes therein and a pattern of connector strips therein, and thereafter transferring one of said circuits to a printed circuit board, comprising:
   a. providing a printed circuit board having a pattern of holes therethrough and a pattern of connector strips thereon which match the respective patterns of said solderless breadboard socket;
   b. positioning said circuit board in an aligned relationship to said solderless breadboard socket;
   c. breadboarding circuits by inserting the leads of electronic components through said printed circuit board and into said solderless breadboard socket until the desired circuit is found;
   d. utilizing a composite of said printed circuit board and said solderless breadboard socket as one side of a container wherein the component side of said printed circuit board forms an inner surface of said container;
   e. introducing paticles into said container in sufficient quantity to surround and cover said components;
   f. enclosing said particles within the container whereby said components are held onto the printed circuit board by said particles;
   g. separating said solderless breadboard from said printed circuit board; and,
   h. affixing the leads of said electronic components to conductive strips bonded to said printed circuit board to make electrical contact therewith.

4. Apparatus useful for facilitating transfer of electronical components from a composite formed by placing a printed circuit board into contacting and aligned relationship with a breadboard and inserting component leads therethrough, comprising:
   a. a frame for a container having at least two open sides;
   b. means for engaging said composite as one side of said container; and,
   c. means for enclosing the other open side of said container.

5. Apparatus of claim 4 wherein said frame is a frame for a six-sided rectangular container.

6. Apparatus of claim 5 wherein said means for engaging comprise a pair of parallel slots along the inner surfaces of two elongated side wall members whereby said composite may be inserted into said slots.

* * * * *